(12) United States Patent
Gauvrit et al.

(10) Patent No.: US 11,927,638 B2
(45) Date of Patent: Mar. 12, 2024

(54) AUTOMATIC DETECTION OF A HARDWARE CONFIGURATION OF A DEVICE ON BOARD AN AIRCRAFT

(71) Applicant: SAFRAN AIRCRAFT ENGINES, Paris (FR)

(72) Inventors: Jacques Paul Michel Gauvrit, Moissy-Cramayel (FR); Davy Philippe Masson, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 82 days.

(21) Appl. No.: 17/631,875

(22) PCT Filed: Jul. 31, 2020

(86) PCT No.: PCT/FR2020/051413
§ 371 (c)(1),
(2) Date: Jan. 31, 2022

(87) PCT Pub. No.: WO2021/019191
PCT Pub. Date: Feb. 4, 2021

(65) Prior Publication Data
US 2022/0283225 A1 Sep. 8, 2022

(30) Foreign Application Priority Data
Jul. 31, 2019 (FR) ...................................... 1908754

(51) Int. Cl.
*G01M 15/14* (2006.01)
*G01R 31/34* (2020.01)

(52) U.S. Cl.
CPC ........... *G01R 31/343* (2013.01); *G01M 15/14* (2013.01)

(58) Field of Classification Search
CPC ............................ G01R 31/343; G01M 15/14
See application file for complete search history.

(56) References Cited

U.S. PATENT DOCUMENTS 5,997,360 A * 12/1999 Gen-Kuong ....... H01R 13/6683
439/700
2009/0277519 A1* 11/2009 Parker ................... F15B 19/002
137/625.65

(Continued)

OTHER PUBLICATIONS

International Patent Application No. PCT/FR2020/051413, International Search Report and Written Opinion dated Jan. 20, 2021, 15 pgs.

(Continued)

*Primary Examiner* — Natalie Huls
*Assistant Examiner* — Sharad Timilsina
(74) *Attorney, Agent, or Firm* — Cozen O'Connor

(57) ABSTRACT

A method for detecting a hardware configuration of a device intended to be carried aboard an aircraft turbomachine and controlled by a two-channel protection calculator (8), comprising a power supply able to supply the device, a first measuring box (16) able to measure a first voltage $V_{s1}$ at the output of the device and a second measuring box (18) capable of measuring a second voltage $V_{s2}$ at the output of the device:

a) Send a control voltage to the input of the equipment Vc;
b) Measure the first voltage $V_{s1}$ and the second voltage $V_{s2}$;
c) Infer the hardware configuration of the device from the values of the first and second voltages measured $V_{s1}$ and $V_{s2}$.

17 Claims, 3 Drawing Sheets

(56) References Cited

U.S. PATENT DOCUMENTS

2009/0301575 A1* 12/2009 Arnett .................... F02C 7/232
                                                    137/468
2016/0092192 A1   3/2016 Frayssignes et al.
2016/0245144 A1   8/2016 Selberg et al.
2018/0370651 A1* 12/2018 Miller ...................... B60L 3/12

OTHER PUBLICATIONS

French Patent Application No. 1908754; Search Report dated May 19, 2020; 2 pgs.

* cited by examiner

AUTOMATIC DETECTION OF A HARDWARE CONFIGURATION OF A DEVICE ON BOARD AN AIRCRAFT

CROSS-REFERENCE TO RELATED APPLICATIONS

This application is a 35 U.S.C. § 371 filing of International Application No. PCT/FR2020/051413 filed Jul. 31, 2020, which claims the benefit of priority to French Patent Application No. 1908754 filed Jul. 31, 2019, each of which is incorporated herein by reference in its entirety.

TECHNICAL FIELD OF THE INVENTION

The invention relates to onboard devices in an aircraft, in particular fuel-regulation devices, especially for a turbomachine such as a turbojet or turboprop engine.

PRIOR ART

There are several onboard calculators in aircraft aimed at supervising the various onboard devices, in order to ensure their proper operation. In particular, devices whose malfunction is critical, such as a turbomachine, require supervision by two calculators, one of the calculators being dedicated to redundancy and used in the event of the first calculator malfunctioning. These calculators are also called protection calculators. One of their tasks is to prevent the flow of fuel to the turbomachine if a malfunction is identified, so as to avoid a catastrophic event.

From one turbomachine model to another, depending on their architecture, the protection calculators may be required to control Fuel-Metering Units (FMU). In each FMU, the fuel flow is metered by a metering valve, usually called a Fuel-Metering Valve (FMV). This FMV is controlled by the EEC (Electronic Engine Control) calculator of the turbomachine through a servo valve, which evaluates the metered mass flow Q by the following formula for calculating the flow through an orifice:

$$Q = K_S * S\sqrt{\rho * \Delta P} \quad \text{[Math 1]}$$

where ΔP is the pressure differential between upstream and downstream of the FMV, S is the section of the orifice through which the fuel fluid passes in the FMV, ρ is the density of said fluid and Ks is a parameter related to the FMV.

The FMV typically comprises a movable element, the position of which is controlled so as to vary the section of the fuel orifice. In this way, a flow rate setpoint of the control calculator can be converted into a position setpoint of the movable element. This movable element can be combined with a Linear Variable Differential Transducer (LVDT). When the element is translational, it is usually called a "spool".

The position of the spool as measured by the LVDT sensor is transmitted to the EEC control calculator which controls the spool movement via a servo valve. The dosed mass flow rate depends on the position of the movable spool, since the pressure differential is kept constant.

There are different models of regulation devices, with different hardware characteristics, and thus in particular requiring different control currents. It is also possible, during maintenance operations, to replace a first FMU model with a second FMU model. Sending too high a control current can damage the control device and sending too low a control current can affect the protection of the turbomachinery in the event of a malfunction.

At the current time, information about the turbomachine architecture, i.e. the number, positioning and FMU model used, is entered into the protection application software run by the protection calculators.

Thus, a modification of the FMU model, during a maintenance operation, requires a modification of the protection application software to avoid any operating problems.

The purpose of the invention is in particular to provide a simple, effective and economical solution to the problems of the prior art described above.

SUMMARY OF THE INVENTION

To this end, a method is proposed for detecting a hardware configuration of a device, intended to be carried onboard a turbomachine and controlled by a two-channel protection calculator, comprising a power supply able to supply the device, a first channel comprising a first measuring box able to measure a first voltage $V_{s1}$ at the output of the equipment and a second channel comprising a second measuring box capable of measuring a second voltage $V_{s2}$ at the output of the device:
  a) Send a control voltage to the input of the equipment Vc;
  b) Measure the first voltage $V_{s1}$ and the second voltage $V_{s2}$;
  c) Infer the hardware configuration of the device from the values of the first and second voltages measured $V_{s1}$ and $V_{s2}$.

For a given control voltage (Vc), a hardware configuration is associated with specific values of the first and second voltage.

When the device is, for example, an FMU, such a method, implemented on a protection calculator, makes it possible, during a phase of powering up the devices, i.e. when the latter are starting up, to automatically detect the FMU model connected to the protection calculators, and therefore to adapt the control current to each FMU model.

Thus, based on the electrical characteristics of the FMU models, it is possible to infer their models. For this purpose, the voltage response of a control voltage is analysed in order to infer automatically, i.e. without human intervention, the hardware configuration of each device.

Thus, by performing a discriminatory test of the configuration, the solution ensures the control of devices of heterogeneous hardware configuration, while guaranteeing protection against unexpected malfunctions of the turbomachine (Hazardous Engine Effects).

In addition, the device may be a fuel-metering unit comprising a movable element and having one of the following hardware configurations:
  a first hardware configuration where the fuel-metering unit comprises a device for measuring the position of the movable element; —a second hardware configuration where the fuel-metering unit does not comprise a position-measuring unit, and of which a wiring or a harness wiring establishes a short circuit between a control module and the measuring boxes of the protection calculator
  a third hardware configuration in which the fuel-metering unit does not include a position-measuring unit, and in which the wiring or wiring of the harness establishes an open circuit between the control module and the measuring boxes of the protection calculator.

The protection calculator is adapted to recognise the hardware configuration from one of the three above mentioned configurations from the values of the first and second voltages measured.

Today, there are three physical configurations for fuel-metering units. The first configuration is characterised by the presence of a unit to measure the position of the fuel-metering unit. This measuring unit can be, for example, a passive electrical sensor such as an LVDT, whose input is supplied with a control voltage and whose windings can provide two output voltages whose values depend on the position of two movable rods connected to the fuel-metering unit. The second and third hardware configurations do not comprise a unit for measuring the position of the fuel-metering unit, the information relating to the position of the metering device being obtained, for example, from a measurement of the flow rate, and with knowledge of the various parameters of the formula [Math 1], in particular the pressure differential at the terminals of the metering unit. This formula links the flow rate to the free section of the dispenser, which depends on the position of the moving unit.

In addition, the control voltage Vc is sent by the protection calculator.

In fact, the fuel-metering units are directly controlled by the protection calculator which, in the event of malfunctions, is able to cut off the fuel supply in order to avoid any catastrophic event such as an overspeed start of the turbomachine which could result in a burst turbine disc.

Thus, the control voltage Vc can be a DC voltage below 15V.

In particular, the first and second voltages measured $V_{s1}$ and $V_{s2}$ can each be compared with threshold values $S_1$, $S_2$ and $S_3$, such that $S_1 < S_2 < S_3$, in particular where $S_1 \in [0; 0,1 \times Vc]$, $S_2 \in [0,8 \times Vc; 0,9 \times Vc]$ et $S_3 \in [0,9 \times Vc; 1,1 \times Vc]$, Vc being the control voltage.

Also, the sum of the first and second voltages measured $V_{s1}+V_{s2}$ can be compared with threshold values $S_3$, $S_4$ and $S_5$, such that $S_3 < S_4 < S_5$, in particular where $S_4 \in [0; 0,1 \times Vc]$, $S_5 \in [0,9 \times Vc; 1,1 \times Vc]$ et $S_6 \in [1,8 \times Vc; 2,2 \times Vc]$, Vc being the control voltage.

Depending on the value of the voltages $V_{s1}$ and $V_{s2}$ measured at the output of the fuel-metering unit and the resistance of this unit, regardless of its structure, it is possible to determine the hardware configuration of the unit automatically. In other words, the voltage response of the fuel-metering unit to a control voltage of 7V sent by the calculator allows the calculator to identify, for each of the fuel-metering units, its hardware configuration automatically, when it is switched on. Thus, the protection calculator can then adapt the levels of these control voltages for each of the fuel-metering units depending on its hardware configuration, i.e. its model.

The present document also relates to a calculator program comprising instructions for implementing the method as described above, when executed on a processor.

The present document also relates to a protection calculator comprising a processor coupled to a memory such that the aforementioned program is stored on the memory.

DETAILED DESCRIPTION OF THE INVENTION

During maintenance operations, the replacement of a fuel-metering unit (FMU) does not necessarily imply an identical replacement, so that a fuel-metering unit with a first hardware configuration can be replaced by a metering unit with a second hardware configuration.

Figure 1:
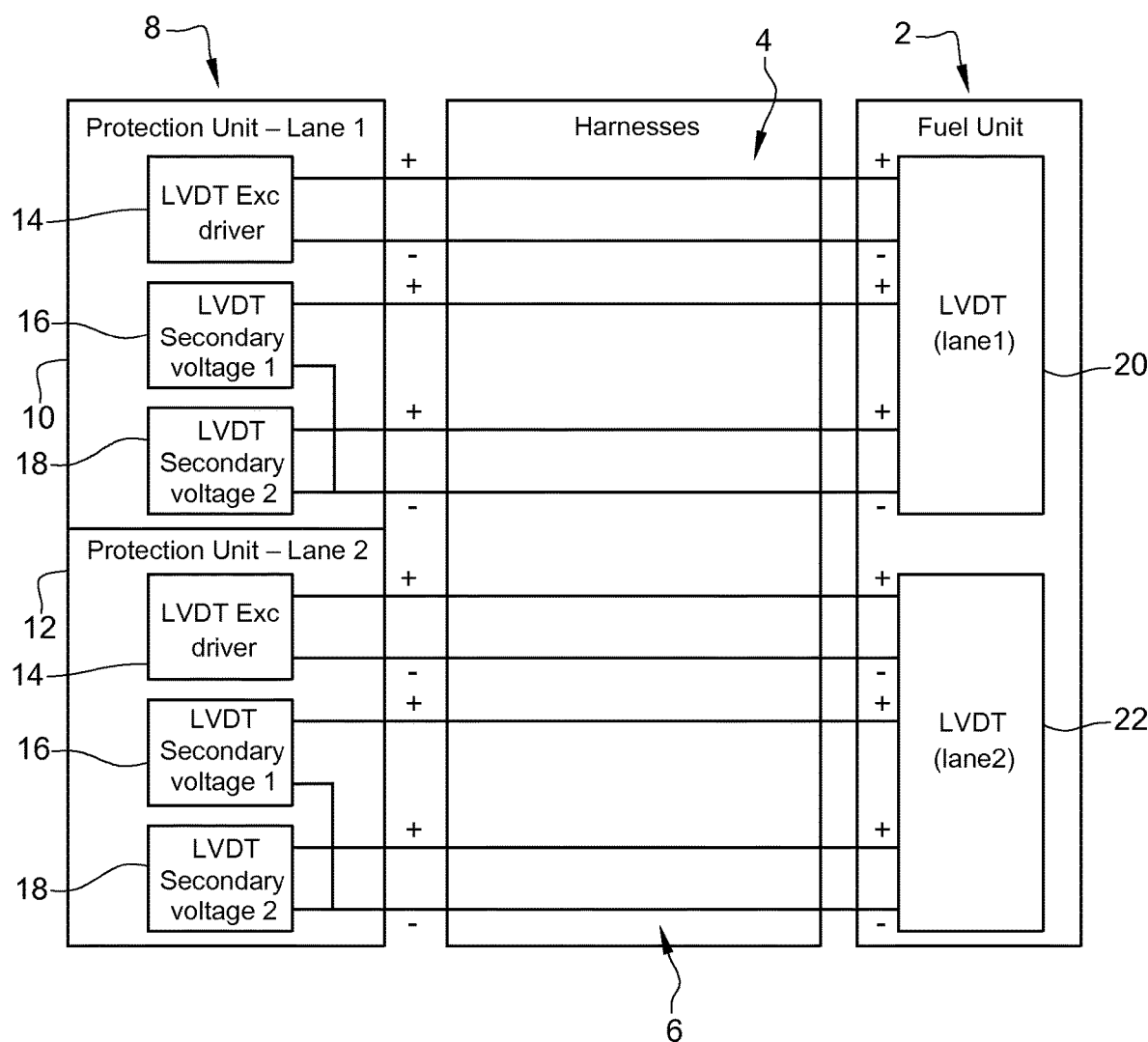
FIG. 1 shows a first configuration of a fuel-metering unit.
Figure 2:
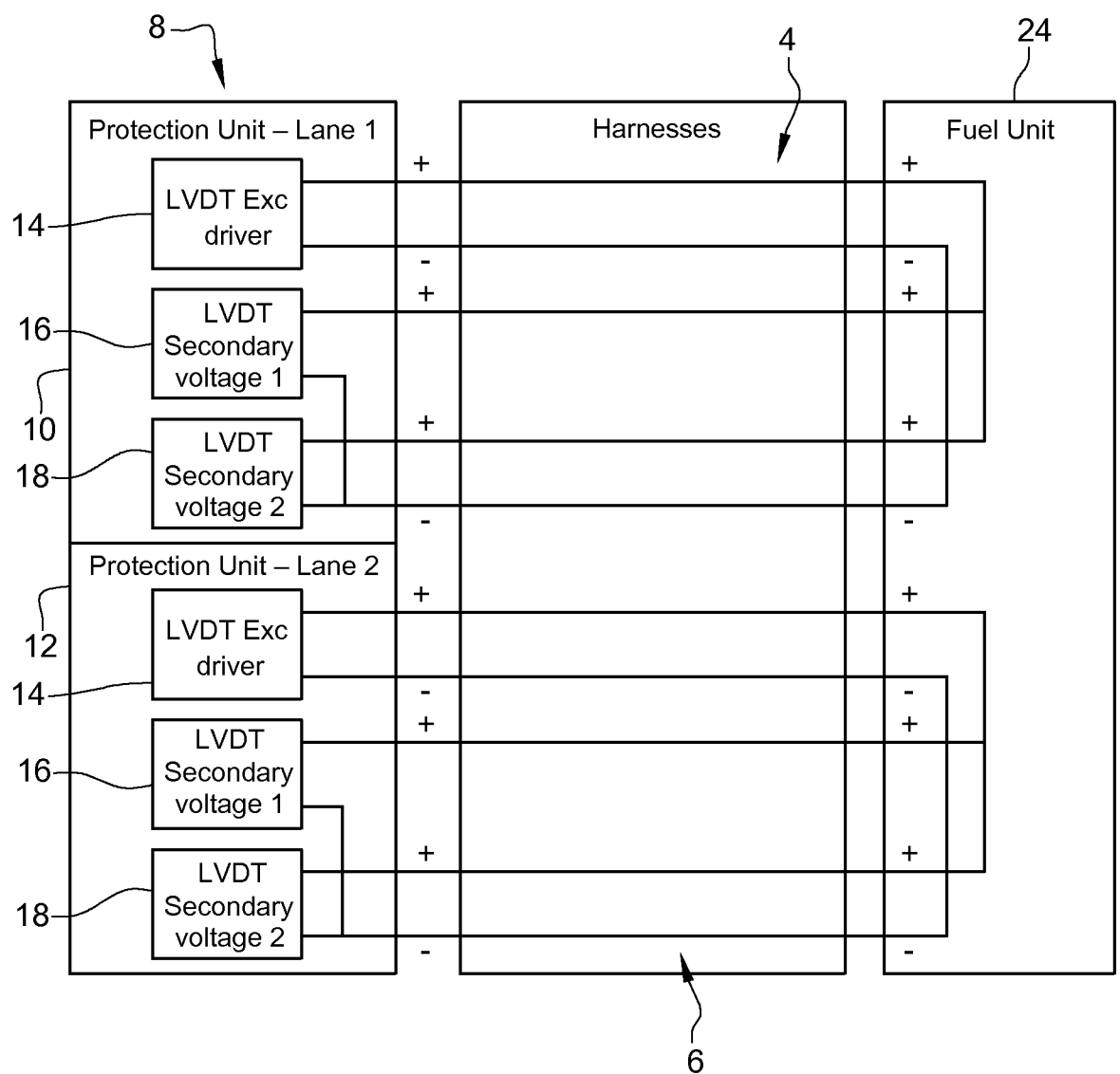
FIG. 2 shows a first configuration of a fuel-metering unit.
Figure 3:
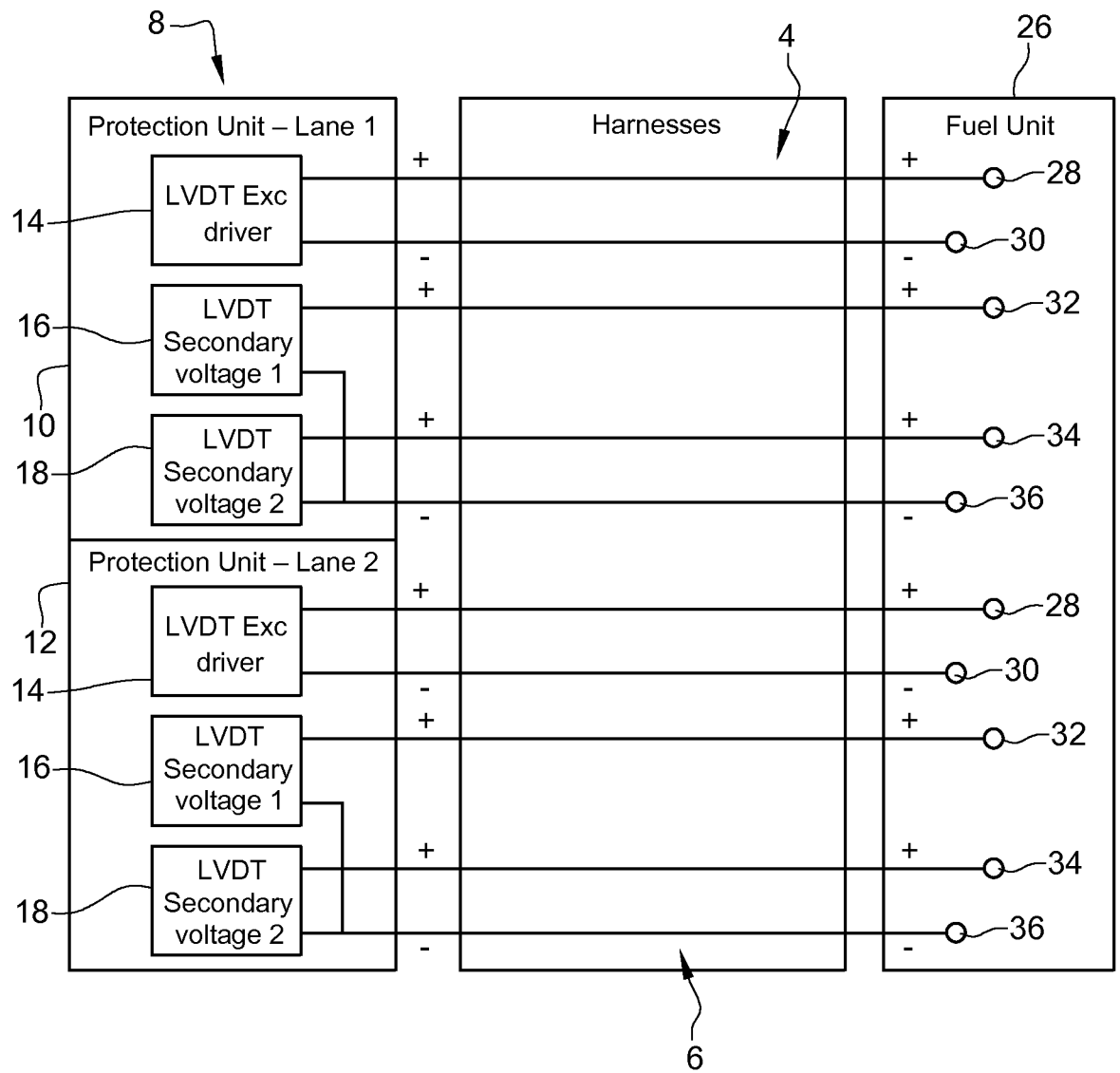
FIG. 3 shows a first configuration of a fuel-metering unit.

Three models of fuel-metering units are currently in use, each with its own hardware configuration as shown in FIGS. 1, 2 and 3 respectively.

As can be seen, in the turbomachine, the fuel-metering units 2 are connected via two separate harnesses 4, 6 to a two-channel protection calculator 8. This protection calculatorcalculator 8 actually comprises two independent calculators 10, 12, one main and one secondary, communicating with each other and performing the same operations/calculations. This calculator redundancy is particularly necessary in the event of a malfunction of the main calculator 10: the latter is then isolated and the secondary calculator 12 then becomes the calculator in charge of controlling the equipment, particularly the fuel-metering units 2.

Each of the protection calculators 10, 12 comprises:
a control module 14, able to send control voltages Vc to the various devices 2 under the supervision of the protection calculator 8. This control voltage, specific to each device, is thus able to supply the target device 2.
a first 16 and a second 18 measuring box, suitable for measuring voltages $V_{s1}$ and $V_2$ emitted at the output of the devices in response to a control voltage sent by the control module 14. Also, although not shown in FIGS. 1 to 3, the calculator calculatorcomprises a processor coupled to a memory, capable of performing calculations to control the various devices supervised by the protection calculatorcalculator.

The first hardware configuration of the first model of fuel-metering unit 2 is characterised by the presence of a passive electrical sensor 20, which makes it possible to obtain the position of the fuel-metering unit. This sensor is usually an LVDT (Linear Variable Differential Transformer) sensor, and is also redundant, so that the first LVDT sensor 20 is connected to the first calculatorcalculator 10 and the second LVDT sensor 22 is connected to the second calculatorcalculator 12.

Thus, in response to a supply voltage from the control modules 14 of the first and second channels 10, 12 (i.e. the first and second calculators), the voltages $V_{s1}$ and $V_{s2}$ at the output of the LVDT sensors 20, 22 are measured on the two channels 10, 12 respectively.

This first model is usually called the Cutback FMU.

The second hardware configuration of the second fuel-metering unit model 24 differs from the first hardware configuration of the first model in that there is no LVDT. Therefore, in contrast to the first configuration, the calculator 8 does not receive any feedback from an LVDT. Indeed, as can be seen in FIG. 2, the output voltage of the power supply unit of the control module is equal to the output voltage of the fuel-metering unit. In other words, a deliberate short circuit is implemented on both channels of the protection calculator 10, 12. The terminals of the control module 14 are directly connected to the terminals of the measuring boxes 16, 18. The short circuit is implemented either at the level of the harness 4 or directly at the level of the device, i.e. the fuel-metering unit 24. Thus, the second hardware configuration is one where the fuel-metering unit 24 does not include a position-measuring unit 20, and its wiring or the wiring of the harness establishes a short circuit between the control module 14 and the measuring boxes 16, 18, of the two-channel protection calculator 8.

The third hardware configuration of the third fuel-metering unit model 26, like the second configuration, does not include an LVDT. The third hardware configuration 26 differs from the second hardware configuration in that a voluntary open circuit is created on both channels 10, 12. Indeed, as can be seen in FIG. 3, given the absence of the LVDT, the calculator 8 no longer receives a signal from an LVDT sensor. Furthermore, in contrast to the second configuration 24, the control module 14 is connected to a first 28 and second 30 terminals of the fuel-metering unit 26 isolated from each other so as to form an open circuit. The two-channel measuring boxes 10, 12 are not connected to the control module 14, but to third 32, fourth 34 and fifth 36 terminals which are isolated from each other or alternatively connected to a common ground. This third design 26, generally referred to as the Baseline, is characterised by a fuel-metering unit 24 which does not include a position-measuring unit. In addition, its wiring or the wiring of the harness of this third model 26 establishes an open circuit between the control module 14 and the measuring boxes 16, 18 of the two-channel protection calculator 8.

The method of detecting the model of the fuel-metering unit used is based primarily on the voltages measured by the measuring boxes under a 7V DC supply to the fuel-metering unit.

It is implemented as a calculator program comprising instructions for implementing this detection process when executed on a processor. In particular, it is stored in the memory of the calculator coupled to the processor, so that it can be executed by the protection calculator.

In this way, the detection of the hardware configuration of the fuel-metering units connected to the protection calculator is automatic.

The detection method consists, in a first step, in sending a control voltage to the input of the equipment, i.e. the fuel-metering unit 2, 24, 26 Vc. This control voltage Vc is a DC voltage equal to 7 V.

In a second step, the measuring boxes 16, 18, measure the first and second secondary voltages $V_{s1}$ and the second secondary voltage $V_{s2}$ at the output of the fuel-metering unit 2, 24, 26.

Depending on the voltages measured $V_{s1}$ and $V_{s2}$ the hardware configuration of the fuel-metering unit 2, 24, 26, i.e. the model used, is inferred. Indeed, the hardware configurations presented above are characterised by the following voltage values:

TABLE 1

| | Hardware configuration of the metering unit | | |
|---|---|---|---|
| | Configuration 1 | Configuration 2 | Configuration 3 |
| $V_{S1}$ or $V_{S2}$ | <6 V | <7 V | <0 V |
| $V_{S1}$ + $V_{S2}$ | <7 V | <14 V | <0 V |

Thus, the first configuration of the fuel-metering unit 2, comprising an LVDT sensor 20, whose output signal is measured, is characterised by voltages measured $V_{S1}$ and $V_{S2}$ such that $V_{S1}$<6V and $V_{S2}$<6V and $V_{S1}$+$V_{S2}$~7V.

The second configuration of the fuel element 24, which does not include an LVDT, is characterised by voltages measured $V_{S1}$ and $V_{S2}$ such that $V_{S1}$~7V and $V_{S2}$~7V and $V_{S1}$+$V_{S2}$~14V. Indeed, due to the voluntary short circuit, the voltages $V_{S1}$ and $V_{S2}$ are both approximately equal to the DC voltage delivered by the control module, i.e. a DC voltage of 7V.

The second configuration of the fuel element 26, which does not include an LVDT, is characterised by voltages measured $V_{S1}$ and $V_{S2}$ such that $V_{S1}$~0V and $V_{S2}$~0V and $V_{S1}$+$V_{S2}$~0V. Indeed, due to the voluntary open circuit, the voltages $V_{S1}$ and $V_{S2}$ are both approximately zero.

As a result, the voltages $V_{S1}$ and $V_{S2}$ are compared to the threshold values $S_1$, $S_2$ and $S_3$ with the following values 0V, 6V and 7V respectively. Alternatively, or additionally, the sum of the voltages measured is compared with the threshold values $S_3$, $S_4$ and $S_5$ with the following values respectively: 0V, 7V and 14V.

In general, the values of the thresholds can be in the following ranges respectively:

$S_1 \in [0; 0,1 \times Vc]$, $S_2 \in [0,8 \times Vc; 0,9 \times Vc]$ et $S_3 \in [0,9 \times Vc; 1,1 \times Vc]$, $S_4 \in [0; 0,1 \times VC]$, $S_5 \in [0,9 \times Vc; 1,1 \times Vc]$ et $S_6 \in [1,8 \times Vc; 2,2 \times Vc]$.

Preferably, all the steps of this method are carried out by the protection calculator when the aircraft's devices are switched on.

The invention claimed is:

1. A method for detecting a hardware configuration of a device (2) intended to be carried aboard an aircraft turbomachine and controlled by a two-channel protection calculator (8), comprising:
   a power supply able to supply the device that comprises a control module adapted to send a control voltage to the input of the device (2);
   a first measuring box (16) able to measure a first voltage ($V_{s1}$) at the output of the device; and
   a second measuring box (18) capable of measuring a second voltage ($V_{s2}$) at the output of the device, the method comprising:
   a) sending a control voltage (Vc) to the input of the device (2);
   b) measuring the first voltage ($V_{s1}$) and the second voltage ($V_{s2}$);
   c) inferring the hardware configuration of the device (2) from the values of the first and second voltages measured ($V_{s1}$, $V_{s2}$), by means of the two-channel protection calculator (8), which is adapted to recognize the configuration of the device (2) from said first and second measured voltage values.

2. The method according to claim 1, wherein the device is a fuel-metering unit (2, 24, 26) comprising a movable element and having one of the following hardware configurations:
   a first hardware configuration where the fuel-metering unit (2) comprises a position-measuring unit (20) for the movable element;
   a second hardware configuration where the fuel metering member (24) does not comprise a position-measuring unit (20), and where a wiring or a harness wiring establishes a short circuit between a control module (14) and the measuring boxes (16, 18) of the protection calculator (8); or
   a third hardware configuration where the fuel-metering unit (26) does not include a position-measuring unit (20), and where the wiring or harness wiring establishes an open circuit between the control module (14) and the measuring boxes (16, 18) of the protection calculator (8).

3. The method according to claim 1, wherein the control voltage (Vc) is sent by the protection calculator (8).

4. The method according to claim 1, wherein the control voltage (Vc) is a DC voltage of less than 15V.

5. The method according to claim 1, wherein the first and second voltages measured ($V_{s1}$, $V_{s2}$) are each compared with threshold values $S_1$, $S_2$ and $S_3$, such that $S_1 \in [0;0,1 \times$ Vc], $S_2 \in [0,8 \times Vc; 0,9 \times Vc]$ and $S_3 \in [0,9 \times Vc; 1,1 \times Vc]$ where Vc is the control voltage.

6. The method according to claim 1, wherein the sum $(V_{s1}+V_{s2})$ of the first and second voltages measured $(V_{s1}, V_{s2})$ is compared with threshold values $S_3$, $S_4$ and $S_5$, such that $S_4 \in [0; 0,1 \times Vc]$, $S_5 \in [0,9 \times Vc; 1,1 \times Vc]$ and $S_6 \in [1.8 \times Vc; 2,2 \times Vc]$, where Vc is the control voltage.

7. A non-transitory computer readable memory storing a calculator program comprising computer-executable instructions for implementing the method of claim 1, when executed on a processor.

8. A protection calculator comprising a processor coupled to a memory such that the calculator program of claim 7 is stored in the memory.

9. The method according to claim 1, wherein the device is a fuel-metering unit (2, 24, 26) comprising a movable element and a first hardware configuration where the fuel-metering unit (2) comprises a position-measuring unit (20) for the movable element.

10. The method according to claim 9, wherein the first and second voltages measured $(V_{s1}, V_{s2})$ are each compared with threshold values $S_1$, $S_2$ and $S_3$, such that $S_1 \in [0; 0,1 \times Vc]$, $S_2 \in [0,8 \times Vc; 0,9 \times Vc]$ and $S_3 \in [0,9 \times Vc; 1,1 \times Vc]$, where Vc is the control voltage.

11. The method according to claim 9, wherein the sum $(V_{s1}+V_{s2})$ of the first and second voltages measured $(V_{s1}, V_{s2})$ is compared with threshold values $S_3$, $S_4$ and $S_5$, such that $S_4 \in [0; 0,1 \times Vc]$, $S_5 \in [0,9 \times Vc; 1,1 \times Vc]$ and $S_6 \in [1,8 \times Vc; 2,2 \times Vc]$, where Vc is the control voltage.

12. The method according to claim 1, wherein the device is a fuel-metering unit (2, 24, 26) comprising a movable element and a second hardware configuration where the fuel metering member (24) does not comprise a position-measuring unit (20), and where a wiring or a harness wiring establishes a short circuit between a control module (14) and the measuring boxes (16, 18) of the protection calculator (8).

13. The method according to claim 12, wherein the first and second voltages measured $(V_{s1}, V_{s2})$ are each compared with threshold values $S_1$, $S_2$ and $S_3$, such that $S_1 \in [0; 0,1 \times VC]$, $S_2 \in [0,8 \times Vc; 0,9 \times Vc]$ and $S_3 \in [0,9 \times Vc; 1,1 \times Vc]$, where Vc is the control voltage.

14. The method according to claim 12, wherein the sum $(V_{s1}+V_{s2})$ of the first and second voltages measured $(V_{s1}, V_{s2})$ is compared with threshold values $S_3$, $S_4$ and $S_5$, such that $S_4 \in [0; 0,1 \times Vc]$, $S_5 \in [0,9 \times Vc; 1,1 \times Vc]$ and $S_6 \in [1,8 \times Vc; 2,2 \times Vc]$, where Vc is the control voltage.

15. The method according to claim 1, wherein the device is a fuel-metering unit (2, 24, 26) comprising a movable element and a third hardware configuration where the fuel-metering unit (26) does not include a position-measuring unit (20), and where the wiring or harness wiring establishes an open circuit between the control module (14) and the measuring boxes (16, 18) of the protection calculator (8).

16. The method according to claim 15, wherein the first and second voltages measured $(V_{s1}, V_{s2})$ are each compared with threshold values $S_1$, $S_2$ and $S_3$, such that $S_1 \in [0; 0,1 \times Vc]$, $S_2 \in [0,8 \times Vc; 0,9 \times Vc]$ and $S_3 \in [0,9 \times Vc; 1,1 \times Vc]$, where Vc is the control voltage.

17. The method according to claim 15, wherein the sum $(V_{s1}+V_{s2})$ of the first and second voltages measured $(V_{s1}, V_{s2})$ is compared with threshold values $S_3$, $S_4$ and $S_5$, such that $S_4 \in [0; 0,1 \times Vc]$, $S_5 \in [0,9 \times Vc; 1,1 \times Vc]$ and $S_6 \in [1,8 \times Vc; 2,2 \times Vc]$, where Vc is the control voltage.

\* \* \* \* \*